United States Patent [19]

Ichimura et al.

[11] Patent Number: 5,519,650
[45] Date of Patent: May 21, 1996

[54] SEMICONDUCTOR DEVICE HAVING AN IMPROVED IMMUNITY TO A SHORT-CIRCUIT AT A POWER SUPPLY LINE

[75] Inventors: Tooru Ichimura; Kazuhiro Sakemi; Shigeru Mori; Mikio Sakurai, all of Hyogo, Japan

[73] Assignees: Mitsubishi Electric Engineering Co., Ltd.; Mitsubishi Denki Kabushiki Kaisha, both of Tokyo, Japan

[21] Appl. No.: 301,752

[22] Filed: Sep. 7, 1994

[30] Foreign Application Priority Data

Sep. 29, 1993 [JP] Japan .................... 5-242801

[51] Int. Cl.⁶ .................................. G11C 5/06
[52] U.S. Cl. ................ 365/63; 365/51; 365/226
[58] Field of Search ................ 365/51, 63, 200, 365/226

[56] References Cited

U.S. PATENT DOCUMENTS

| | | | |
|---|---|---|---|
| 4,639,895 | 1/1987 | Iwahashi et al. | 365/200 |
| 4,780,851 | 10/1988 | Kurakami | 365/200 |
| 5,007,025 | 4/1991 | Hwang et al. | 365/226 |
| 5,097,448 | 3/1992 | Segawa | 365/200 |
| 5,231,607 | 7/1993 | Yoshida et al. | 365/226 |
| 5,293,559 | 3/1994 | Kim et al. | 365/226 X |

*Primary Examiner*—Joseph A. Popek
*Attorney, Agent, or Firm*—Lowe, Price, LeBlanc & Becker

[57] ABSTRACT

A semiconductor memory device includes a memory cell array (1) having a plurality of memory cells arranged in rows and columns, a plurality of column select lines (3) extending over the memory cell array and coupled to received column select signals generated by a column decoder (100), a plurality of power supply lines (4) provided in parallel with the column select lines to transfer a power supply voltage from a main power supply line (130), and a plurality of ground lines (5) provided in parallel with the column select lines to transfer a ground voltage from a main ground line. A plurality of fuse elements (6) are provided for each of the column select lines. When a short-circuit is found between a column select line and power supply line or a ground line, a fuse element corresponding to the short-circuited column select line is blown off and the short-circuited column select line is isolated from the column decoder. By repairing the short-circuited column select line with a redundant column select line (60), the memory device operates correctly without an adverse effect of the short-circuit.

16 Claims, 10 Drawing Sheets

SEMICONDUCTOR DEVICE HAVING AN IMPROVED IMMUNITY TO A SHORT-CIRCUIT AT A POWER SUPPLY LINE

DETAILED DESCRIPTION OF THE INVENTION

1. Field of the Invention

The present invention relates to a semiconductor device, and particularly to a power supply line arrangement in a semiconductor memory device.

2. Description of the Background Art

FIG. 1 schematically shows an overall arrangement of an exemplary semiconductor memory device. Referring to FIG. 1, the memory device includes four memory array blocks MA#1, MA#2, MA#3 and MA#4 each including a plurality of memory cells arranged in rows and columns, four row decoders 102a, 102b, 102c and 102d provided for the respective memory arrays MA#1–MA#4, and a column decoder 100 provided commonly for array blocks MA#1–MA#4. Row decoder 102a–102d each selects a row of memory cells or a word line in a corresponding memory array in response to an internal row address signal when activated. Column decoder 100 selects a column in each of memory arrays MA#1–MA#4 in response to an internal column address signal when activated. The internal row and column address signals are time-division multiplexedly produced by a not shown address buffer.

The memory device further includes (SA+IO gate) block 104a provided between memory arrays MA#1 and MA#2 and another (SA+IO gate) block 104b provided between array blocks MA#3 and MA#4. The specific structure of blocks 104a and 104b will be described later. The block 104a includes a plurality of sense amplifiers SA provided corresponding to the columns in array blocks MA#1 and MA#2 and for sensing and amplifying memory cell data read out onto corresponding columns, and IO gates provided corresponding to the columns of memory arrays MA#1 and MA#2 and for connecting corresponding columns with an internal data bus 105a in response to a column select signal from column (COL.) decoder. The block 104b similarly includes a plurality of sense amplifiers SA and a plurality of IO gates provided for the columns of memory arrays MA#3 and MA#4. The block 104b selects a column in memory array(s) MA#3 and/or MA#4 in response to the column select signal from column decoder 100 to connect the selected column(s) to an internal data bus 105b.

The internal data buses 105a and 105b are connected to an input/output circuit 106 for inputting and outputting data DQ. The number of bits of data DQ is arbitrary and may be one or more.

FIG. 2 shows a specific structure of block 104a and 104b of FIG. 1. In FIG. 2, a structure related to a column for the block 104a is representatively shown. Referring to FIG. 2, memory array MA#1 includes a pair of complementary bit lines BLa and /BLa connecting a column of memory cells and a word line WLa connecting a row of memory cells. A memory cell MC connected to word line WLa and bit line BLa is representatively shown. Memory array MA#2 includes a word line WLb connecting a row of memory cells and a pair of complementary bit lines BLb and /BLb connecting a column of memory cells. Memory cell MC at a crossing of word line WLb and bit line BLb is representatively shown.

The block 104a includes a pair of connection gates TGaa and TGab responsive to a block select signal φA for connecting or isolating bit lines BLa and /BLa to or from sense nodes SNa and SNb respectively, a pair of connection gates TGba and TGbb responsive to a block select signal φB for connecting or isolating bit lines BLb and /BLb to or from sense nodes SNa and SNb respectively, a pair of IO gates IOG for connecting sense nodes SNa and SNb to internal data bus 105a including a pair of complementary data lines in response to a column select signal on a column select line CSL, and a sense amplifier SA responsive to a sense amplifier activation signal φSA for sensing and amplifying potentials at sense nodes SNa and SNb.

In a standby state, block signals φA and φB are at H level to turn on connection gates TGaa, TGab, TGba and TGbb, so that bit lines BLa, BLb and /BLa, /BLb are connected to sense nodes SNa and SNb, respectively, and are kept at a predetermined potential level.

In operation, a memory array out of memory arrays MA#1 and MA#2 is selected by a block decoder not shown. Now, it is assumed that array block MA#1 is selected. Block select signal φA is maintained at H level, while block select signal φB is set at L level so that bit lines BLb and /BLb are isolated from sense nodes SNa and SNb.

A word line (WLa) is selected in the selected array block MA#1 by row decoder 102a. Row decoder 102b is kept inactive according to an output of the block decoder. Data of memory cell MC is read out onto bit line BLa and to sense node SNa. Bit line /BLa and sense node SNb maintain the predetermined potential level.

Then, sense amplifier SA is activated in response to sense amplifier activation signal φSA for sensing and amplifying the potentials at sense nodes SNa and SNb.

Then, a column select signal on the line CSL is brought into H level by column decoder 100, and IO gates turn on to connect sense nodes SNa and SNb to internal data bus 105a. Data reading or writing is carried out through input/output circuit 106 for a selected memory cell.

The block 104b has the same configuration as that of block 104a. When array block MA#1 is selected, one of array blocks MA#3 and MA#4 may be also selected, and alternatively none of array blocks MA#3 and MA#4 may be selected.

In the arrangement shown in FIGS. 1 and 2, provision of column decoder 4 commonly to all array blocks MA#1-MA#4 reduces the chip occupation area as compared to the arrangement in which a column decoder is provided for each of array blocks MA#1–MA#4.

Division of a memory array into a plurality of array blocks reduces the length of a bit line and the number of memory cells connected to a bit line and thus the bit line capacitance. Signal propagation delay due to bit line capacitance is decreased and the ratio of bit line capacitance to a memory cell capacitance (memory cell MC including an access transistor and a data storage capacitor) is increased, so that fast and accurate sensing operation is provided due to an earlier sense starting timing and a sufficient large read out voltage on a bit line.

FIG. 3 shows a configuration of a sense amplifier SA shown in FIG. 2. Referring to FIG. 3, sense amplifier SA includes a pair of cross coupled p channel MOS (insulated gate type) transistors PT1 and PT2 between a node 111a and sense nodes SNa and SNb, a pair of cross coupled n channel MOS transistors NT1 and NT2 between a node 111b and sense nodes SNa and SNb, a pair of cross coupled n channel MOS transistors NT1 and NT2, a p channel MOS transistor PT3 responsive to a P sense amplifier activation signal φPSA for transferring an operating power supply voltage VCC on a power supply line 110 to node 111a, and an n channel MOS transistor NT3 responsive to an N sense amplifier activation signal φNSA for transferring another operating power supply voltage (referred to as a ground voltage hereinafter) VSS to node 111b.

MOS transistors PT1 and PT2 constitute a P sense amplifier for raising the potential at a higher potential sense node out of sense nodes SNa and SNb to the supply voltage VCC when the signal φPSA is activated at L level to transfer the supply voltage VCC to node 111a through MOS transistor PT3.

MOS transistors NT1 and NT2 constitute an N sense amplifier for falling the potential at a lower potential node out of sense nodes SNa and SNb to ground voltage when the signal φNSA is activated at H level to transfer the ground voltage VSS to node 111b through MOS transistor NT3.

Power supply line 110 and ground line 112 are provided near the sense amplifier SA from the following view point.

As shown in FIG. 4, an array block includes a plurality of bit line pairs BLP1-BLPn, and sense amplifier SA is provided for each of bit line pairs BLP1-BLPn. When a power supply line 120 and a ground line 124 are provided in common for all the bit line pairs BLP1-BLPn as shown in FIG. 4, all the sense amplifiers SA are connected to a P sense amplifier drive line 122 and an N sense amplifier drive line 126. The drive lines 122 and 126 are connected to a power supply line 120 and a ground line 124 through sense amplifier drive transistors 121 and 125, respectively.

When the sense amplifier activation signals φPSA and φNSA are made active, all the sense amplifiers SA1-SAn receive charging currents from the power supply line 120 and supply discharging currents to ground line 124. A large current is consumed on the power supply line, and the power supply voltage VCC is decreased. This decreased supply voltage might cause a malfunction in other circuit components. As for the ground line 124, the ground voltage is increased due to the discharging current, and an erroneous operation might be caused on other circuit components.

In addition, the drive lines 122 and 126 have an inherent line resistance causing a voltage drop. For example, sense amplifier SA1 receives higher potentials at sense nodes 111a and 111b than sense amplifier SAn. Charging operation of sense amplifier SA1 becomes faster than that of sense amplifier SAn, while sense amplifier SA1 discharges a bit line of bit line pair BLP1 at a slower speed than sense amplifier SAn discharges a bit line of bit line pair BLPn. Sense operation speed is determined by the slowest sense amplifier's operation speed, and fast sensing operation can not be implemented.

In order to avoid the drawback as described above, the power supply line and ground line are provided near sense amplifiers.

In general, the power supply line, the ground line and the column select lines are formed by the same level interconnection layer, as shown in FIG. 5.

FIG. 5 shows a cross sectional view indicating an interconnection line arrangement. Referring to FIG. 5, a LOCOS (local oxidation SiO₂) film LOC is formed at the surface of a semiconductor substrate SUB for memory cell isolation. A word line WL formed of polysilicon is formed on the substrate SUB extending horizontally in the figure. A memory cell capacitor is provided by a conductive layer STN serving as a storage node and another conductive layer CPL formed on and facing to the conductive layer STN and serving as a cell plate. Bit lines BL and /BL extend perpendicularly to word line WL and over the conductive layers CPL and STN. A low resistive conductive layer WLM extends above the bit lines BL and /BL in parallel to the word line WL to be contacted at predetermined intervals to the word line for effectively reducing a word line resistance.

At the uppermost layer, a conductive layer VSS as the ground line, a conductive layer CSL as the column select line and a conductive layer VCC as the power supply line are provided in parallel with each other.

In order to most effectively suppress the effect of voltage change on the power supply line and ground line, it can be contemplated that the power supply line and the ground line are provided for each sense amplifier.

FIG. 6 shows a possible arrangement of the power supply line and the ground line. Referring to FIG. 6, each column select line CSL accompanies the ground line (VCC) 112 and the power supply line (VSS) 110 on both sides alternatively. The power supply lines 110 and the ground lines 112 are coupled to a main power line 130 and a main ground line 140, respectively. Power supply line 110 has a smaller line width than the main power supply line 130, and ground line 112 has a smaller line width than the main ground line 140.

Power supply line 110 and ground line 112 are required to source and sink current to and from sense amplifiers on corresponding two columns as shown in FIG. 6. Referring to FIG. 6, power supply line 110 is coupled to sense node 111a of corresponding adjacent two sense amplifiers SA through drive MOS transistors PT3, and ground line 112 is coupled to two adjacent sense amplifiers SA through associated drive MOS transistors NT3. Voltage change is small on the ground line 112 and power supply line 110, and such small voltage change is absorbed in the wide main power supply line 130 and main ground line 140. Thus, the power supply arrangement would provide stable supply voltage and ground voltage to ensure fast and accurate sensing operation.

FIG. 7 shows an arrangement of the power supply lines. The ground lines and the column select lines extends over a memory array. The memory array 1 includes a plurality of memory blocks, an example of which is shown in FIG. 1. Column select line CSL extends from column decoder 100 over the memory array 1. Power supply line 110 and ground line 112 also extends over memory array 1 from main power supply line 130 and main ground line 140 in parallel with column select line CSL.

If a conductive particle such as etching residue are adsorbed on the memory array 1 in a manufacturing process, short-circuit is likely to occur between column select line CSL and power supply line 130 or ground line 140. If column select line CSL is short-circuited with ground line 112 as shown at R1 in FIG. 7, the potential of the column select line CSL can not be raised and the corresponding column can never be brought into a selected state.

If a column select line CSL is short-circuited with power supply line 110 as shown at R2 in FIG. 7, the power supply line 110 is discharged to the ground voltage through the short-circuited column selected line, and the memory device would not operate correctly.

In repairing the short-circuited column select line, a redundant column select line is used in place of the short-circuited column select line. In this arrangement, the short-circuited column select line is not isolated from column decoder 100. When the short-circuit column select line is addressed, operation of normal decoder (column decoder 100) is inhibited and instead a spare decoder operates to selects the redundant column select line. Thus, current flows into column decoder 100 through the short-circuited column select line to lower the supply voltage VCC.

If a large size particle is adsorbed between power supply line 110 and ground line 112, the device would not operate.

In a recent large storage capacity memory device, a plurality of memory arrays 1 are provided, and if a defective column select line is found in a device test, the memory array is replaced by a redundant memory array. That is, repairing is made on an array basis.

In an old conventional redundancy scheme, such short-circuited column select line is isolated from column decoder 100 by a switching element and also is kept at the ground voltage through a transistor element or a resistance. Therefore, even if the redundancy scheme is employed, the short-circuit itself is not repaired and the memory device would be disposed as a defective device.

In addition, in the conventional redundant column scheme, a column select line does not extends over a memory array, and a column decoder is provided for each of memory array blocks, and a column select line extends from the corresponding column decoder to a corresponding IO gate provided at an end of bit lines near the column decoder in a corresponding array block. Thus, there never occurs short-circuiting between the column select line and the power supply line or the ground line above a memory array region, and no countermeasure against such short-circuit is conventionally considered.

SUMMARY OF THE INVENTION

The object of the present invention is to provide a semiconductor device having a strong immunity against short-circuit due to a conductive particle above a memory array region.

Another object of the present invention is to provide a semiconductor memory device capable of operating normally even if a conductive partice adsorbs on a memory array region.

The semiconductor device according to the present invention includes isolating elements provided for conductive lines extending over a memory array.

When a short-circuiting occurs at a conductive line, a corresponding isolation element is brought into a cut off state, and the influence of the short-circuiting on a column decoder, a power supply line or a ground line can be reliably prevented.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
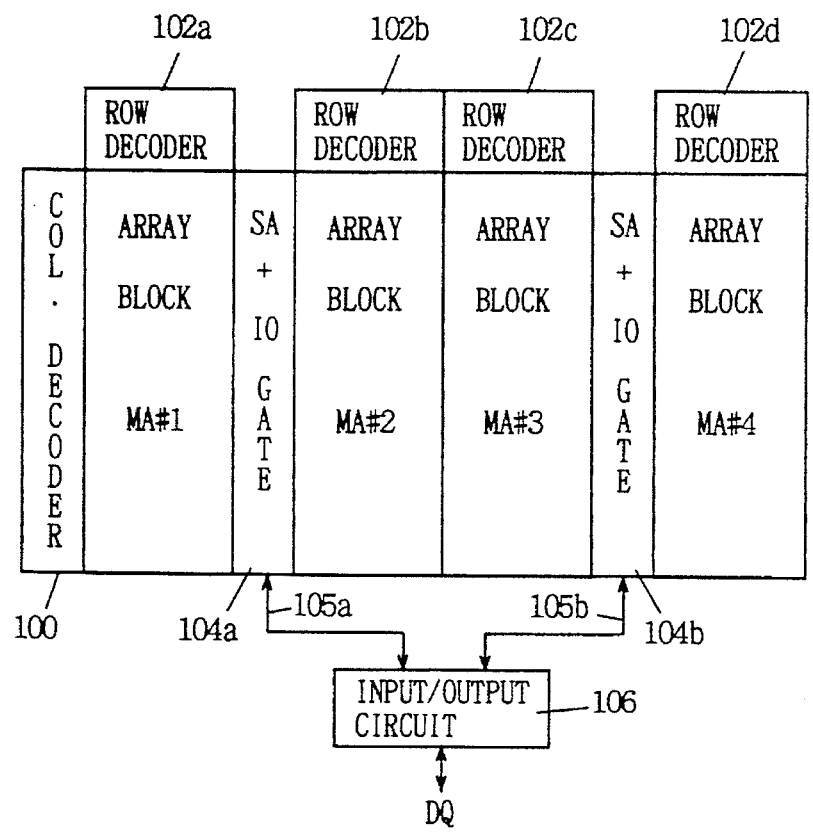
FIG. 1 schematically shows a main portion of a conventional semiconductor memory device.
Figure 8:
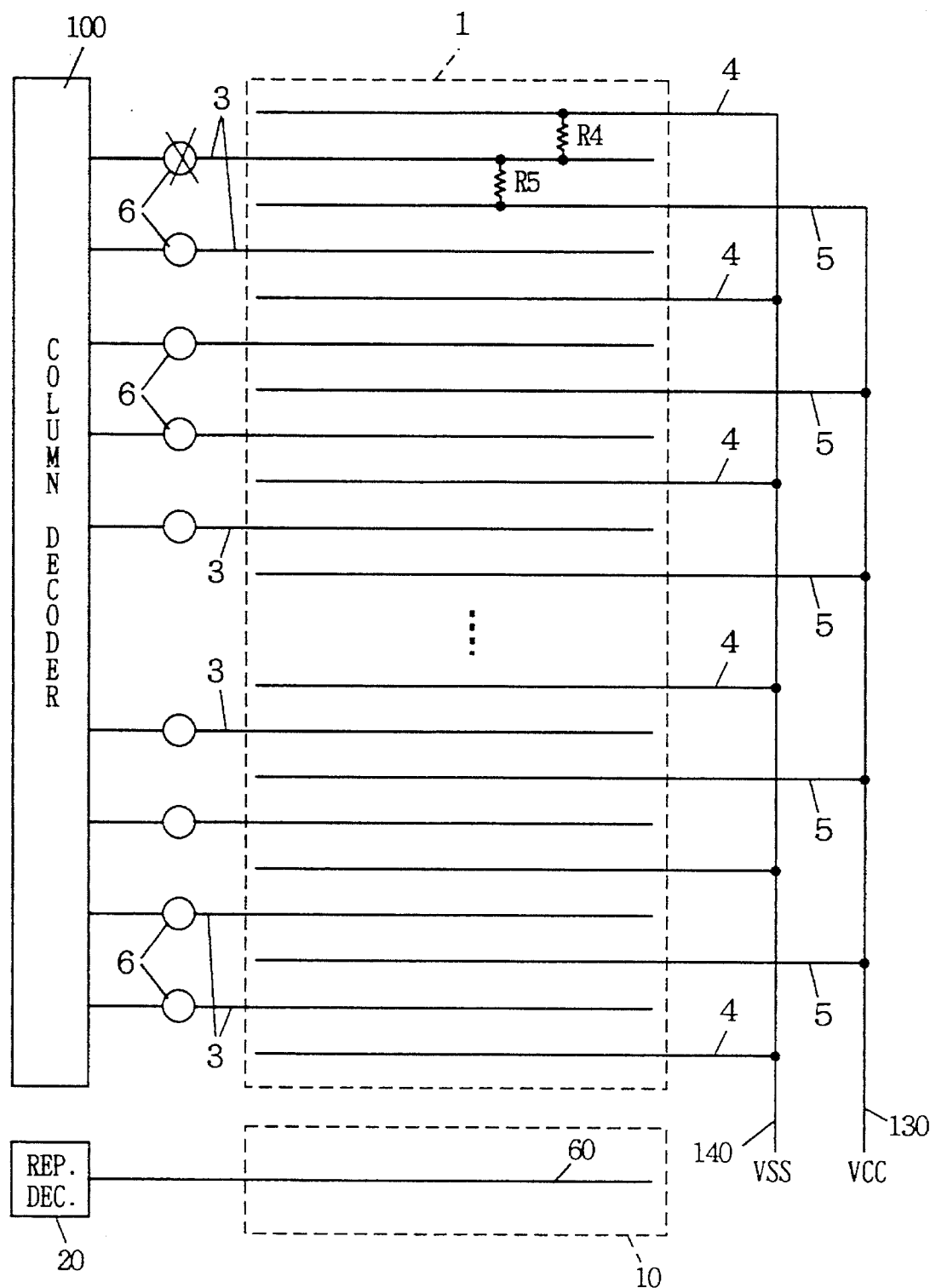
FIG. 8 shows an arrangement of a first embodiment of the present invention.

FIG. 8 shows arrangement of a semiconductor device of an embodiment of the present invention. Referring to FIG. 8, a semiconductor device includes a memory array 1 having a plurality of memory cells arranged in rows and columns. Memory array 1 includes a plurality of array blocks MA as shown in FIG. 1. The number of array blocks may be arbitrary and has only to be two or more. In addition, the semiconductor device may be of shared sense amplifier arrangement as shown in FIG. 1 or has sense amplifiers and IO gates ((SA+IO) blocks as shown in FIG. 1) provided corresponding to the respective array blocks.

The semiconductor device further includes column decoder 100 for decoding an internal address signal not shown to generate a column select signal designating a column of cells in memory array 1, and a plurality of column select lines 3 extending over memory array 1 for transferring column select signal from column decoder 100, a plurality of ground lines 4 extending over memory array 1 in parallel with the column select lines 3, and a plurality of power supply lines 5 extending over memory array 1 in parallel with column select lines 3 and ground lines 4.

Figure 5:
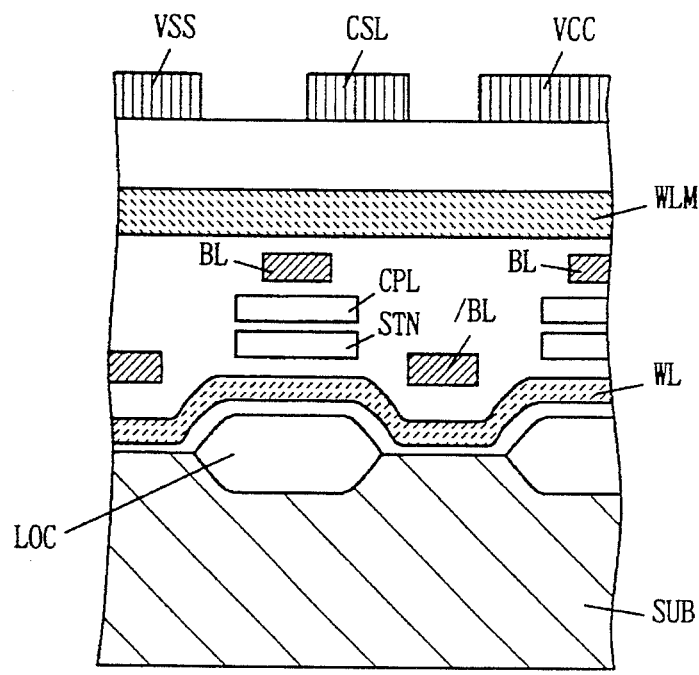
FIG. 5 shows a cross sectional view of a memory array portion of a conventional semiconductor memory device.
Figure 6:
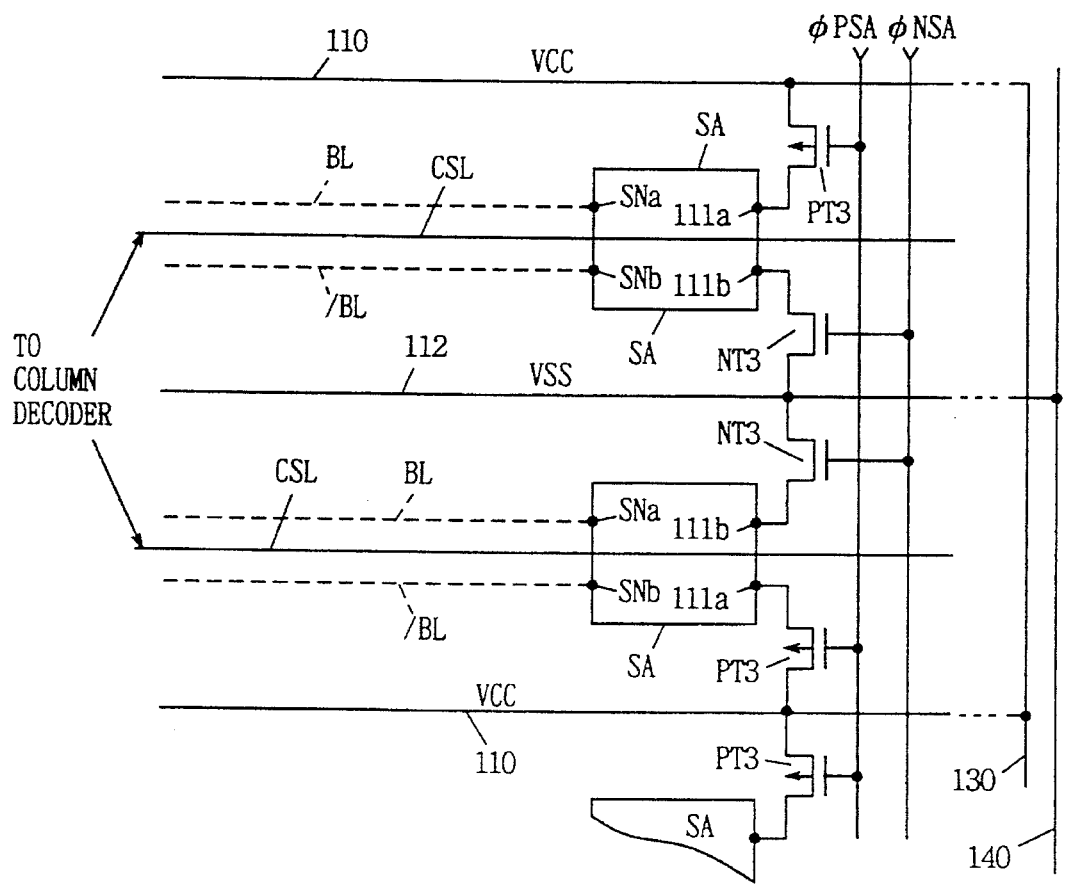
FIG. 6 shows a possible arrangement of column select lines, power supply lines and ground lines in a semiconductor memory device.
Figure 7:
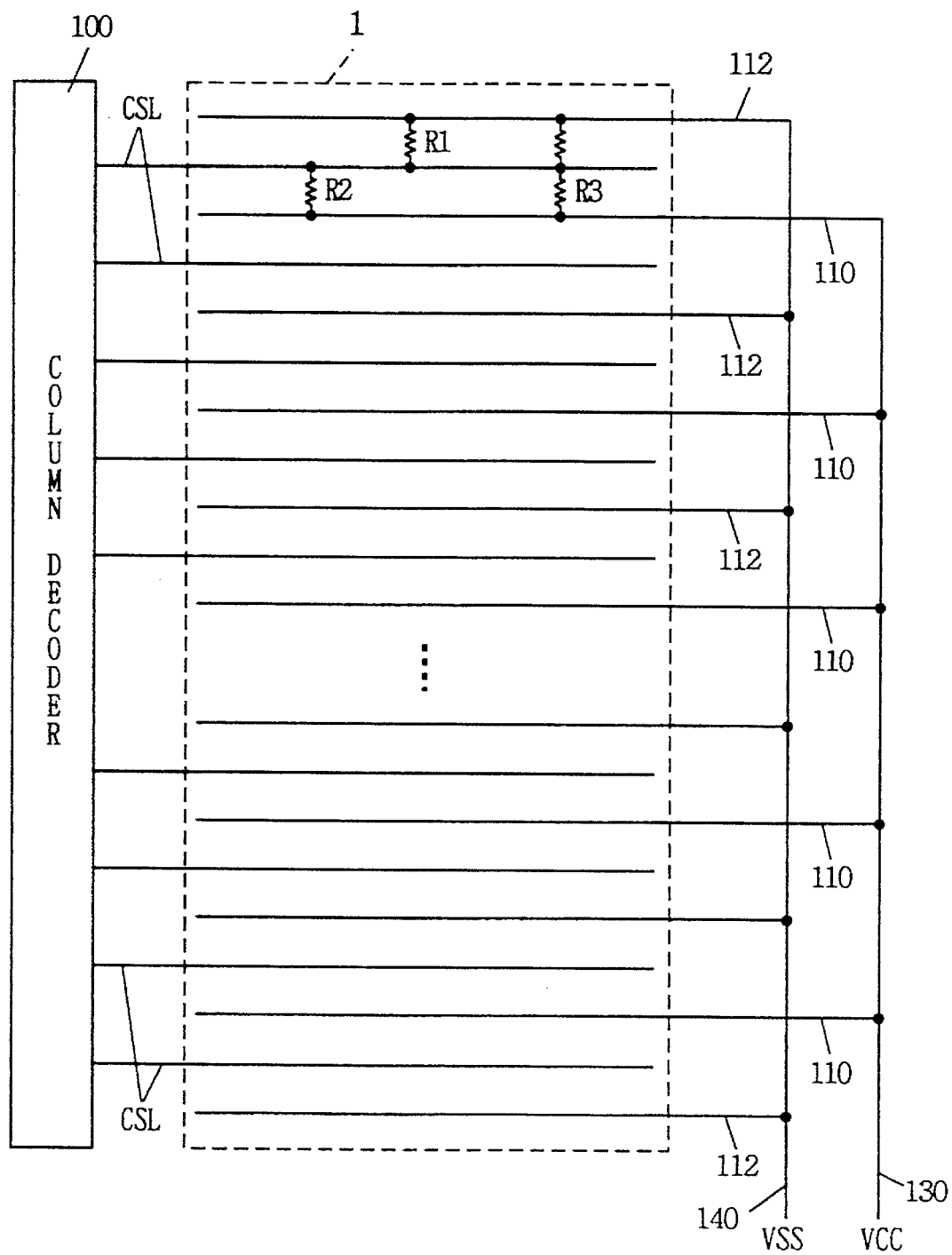
FIG. 7 illustrates an arrangement of column select lines, power supply lines and ground lines used for explaining the problem to be solved by the present invention.

Column select lines 3, ground lines 4 and power supply lines 5 are formed of conductive materials such as aluminum at the same level interconnection layer as shown in FIG. 5. Ground lines 4 transfer a ground voltage VSS and are connected to a main ground line 140 extending along one side of memory array 1 and perpendicularly to the ground lines 4. Power supply lines 5 transfer a power supply voltage and are connected to a main power supply line 130 extending along the one side of memory array 1 in parallel with main ground line 140.

Ground lines 4 and power supply lines 5 are arranged alternately with column select lines 3 interposed therebetween.

Each of column select lines 3 is provided with a fuse element 6 near a corresponding output of column decoder 2. Fuse element 6 is a fusible conductive element which can be cut off or blown off by an energy beam such as a laser beam. The semiconductor device further includes a redundant column select line 60, and a repair decoder (labeled REP. DEC.) 20 for selecting and driving redundant column select line 60 when a defective column select line as described later is addressed.

Redundant column select line 60 selects a column of memory cells arranged in a spare array 10. If a shift redundancy scheme is employed in which outputs of column decoder 100 are shifted in position to be connected to column select lines 3 with a defective column select line separated from column decoder 100, the spare array 10 is included in memory array 1 and repair decoder 20 is included in column decoder 100.

Spare array 10 may be provided dedicatedly for defective column repairing, and repair decoder 20 may have an address of a defective column select line programmed therein. Any repairing redundant scheme can be employed.

If a short-circuit occurs as shown at R4 between an uppermost column select line 3 and an uppermost ground line 4 or at R5 between the uppermost column select line 3 and an uppermost power supply line 5 in FIG. 8, a corresponding fuse element 6 shown by the mark "x" is cut off or blown off by means of an energy beam such as a laser beam. The short-circuited column select line 6 is isolated from column decoder 100. Redundant column select line 60 is used in place of the short-circuited column select line 3. That is, when the short-circuited column select line 6 is addressed, the redundant column select line 60 is selected by repair decoder 20. An output signal from column decoder 100 is not transferred to the short circuited column select line 3.

The short-circuited column select line 3 is simply isolated from column decoder 100 by cut off fuse element, and no pull-up or pull-down element for keeping the short-circuited column select line at a predetermined potential or in a non-selected state is provided.

The short-circuited column select line 3 is electrically isolated from column decoder 100 while being connected to the ground line 4 through the conductive particle or resistance R4, or to the power supply line 5 through a conductive particle or resistance R5. There is no current flow path through the short-circuited column select line 3, and the ground voltage VSS or the power supply voltage VCC can be stably kept at the desired voltage levels without any influence of the short-circuit.

Figure 9:
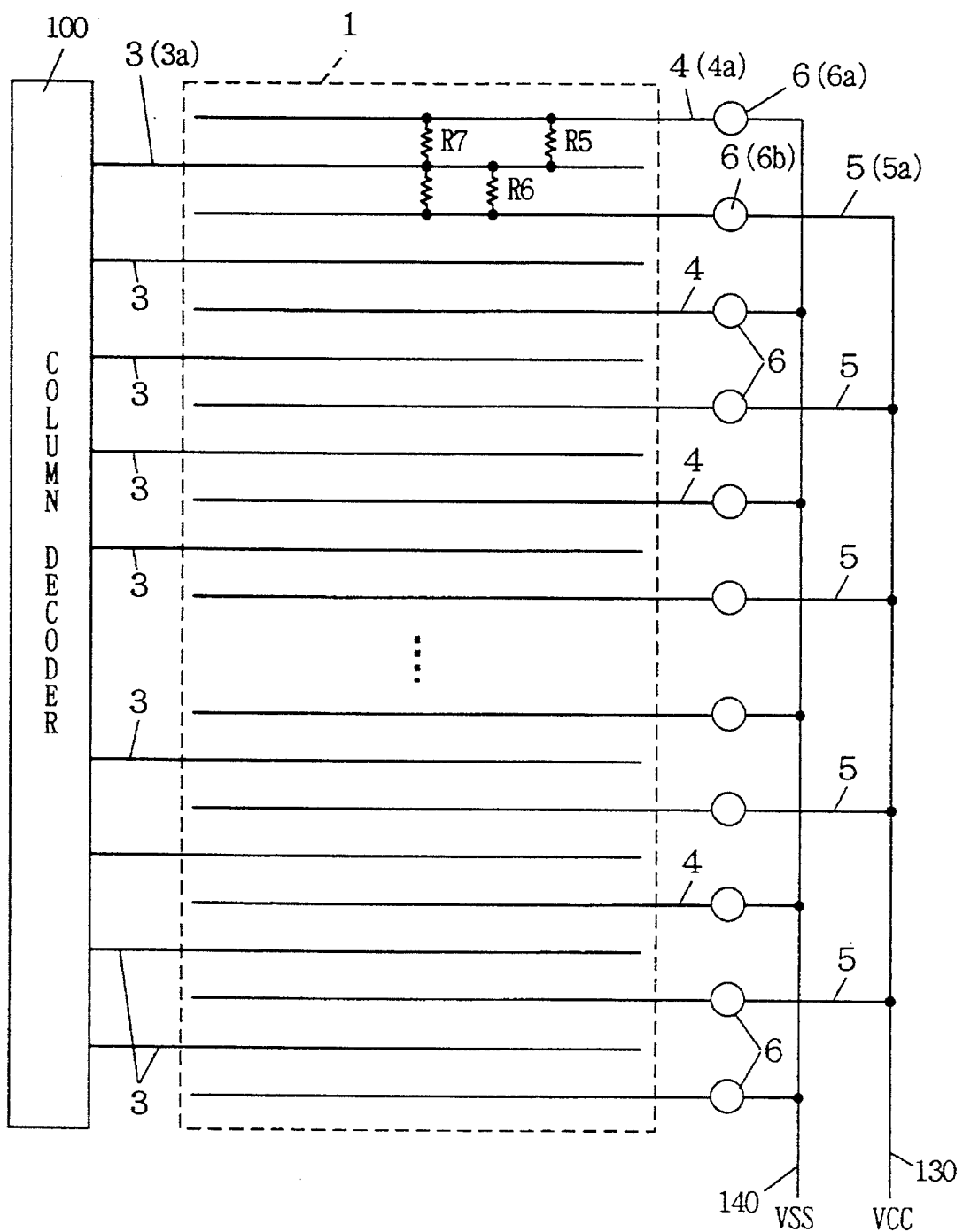
FIG. 9 shows an arrangement of a second embodiment of the present invention.

FIG. 9 shows a schematic arrangement of a second embodiment of the present invention. Referring to FIG. 9, each of ground lines 4 is provided with a fuse element 6 at one end near main ground line 140. Each of power supply lines 5 is also provided with a fuse element 6 at one end near main power supply line 130. No fuse element is provided to a column select line 3. The other arrangements are the same as that shown in FIG. 8.

In the arrangement of FIG. 8, when a column select line 3a is short-circuited through a conductive particle at R5 with a ground line 4a, a fuse element 6a is cut off, and the ground line 4a is isolated from main ground line 140. If the column select line 3a is short-circuited through a conductive particle at R6 with a power supply line 5a, a corresponding fuse element 6b is cut off, and the power supply line 5a is isolated from main power supply line 130. In this arrangement, even if the short-circuit occurs, the column select line 3a can be used as a normal column select line requiring no repairing by a redundant column select line. Alternatively, the short-circuit column select line may be replaced with a repairing redundant column select line.

It can be readily determined whether a column select line 3 is short-circuited with a ground line 4 or a power supply line 5. If a column select line 3 is short-circuited with a ground line 3, a corresponding column of memory cells in memory array 1 can never be selected and a column of memory cells are determined defective. If a column select line 3 is short-circuited with a power supply line 4, a corresponding column of memory cells are always selected, and therefore the other columns of memory cells in memory array 1 are determined defective. Therefore, observation of a pattern of distribution of defective memory cells in memory array 1 would indicate which defective mode (short-circuiting) occurs.

If a power supply line 5a and a ground line 4a are short-circuited by a large size conductive particle at R7, fuse elements 6a and 6b are cut off, and short-circuiting of main ground line 140 and main power supply line 130 can be reliably prevented.

In any short-circuit mode, the semiconductor device operates normally by appropriately cutting off a fuse element.

Figure 10:
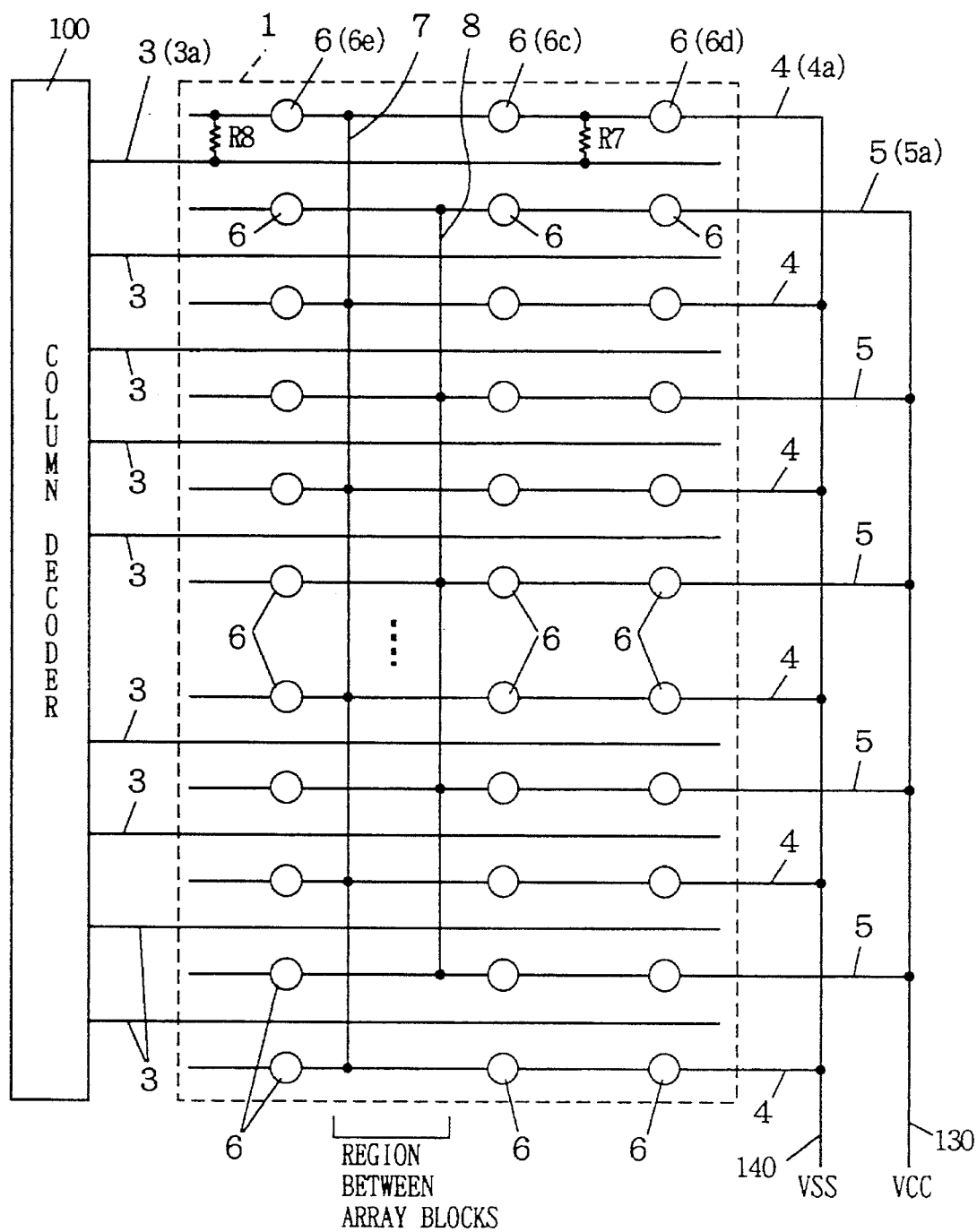
FIG. 10 shows a third embodiment of the present invention.

FIG. 10 shows an arrangement of a third embodiment of the present invention. In the arrangement shown in FIG. 10, each of ground lines 4 is provided with a plurality of fuse elements 6, and also each of power supply lines 5 is provided with a plurality of fuse elements 6. Fuse elements 6 are arranged in lines.

Figure 2:
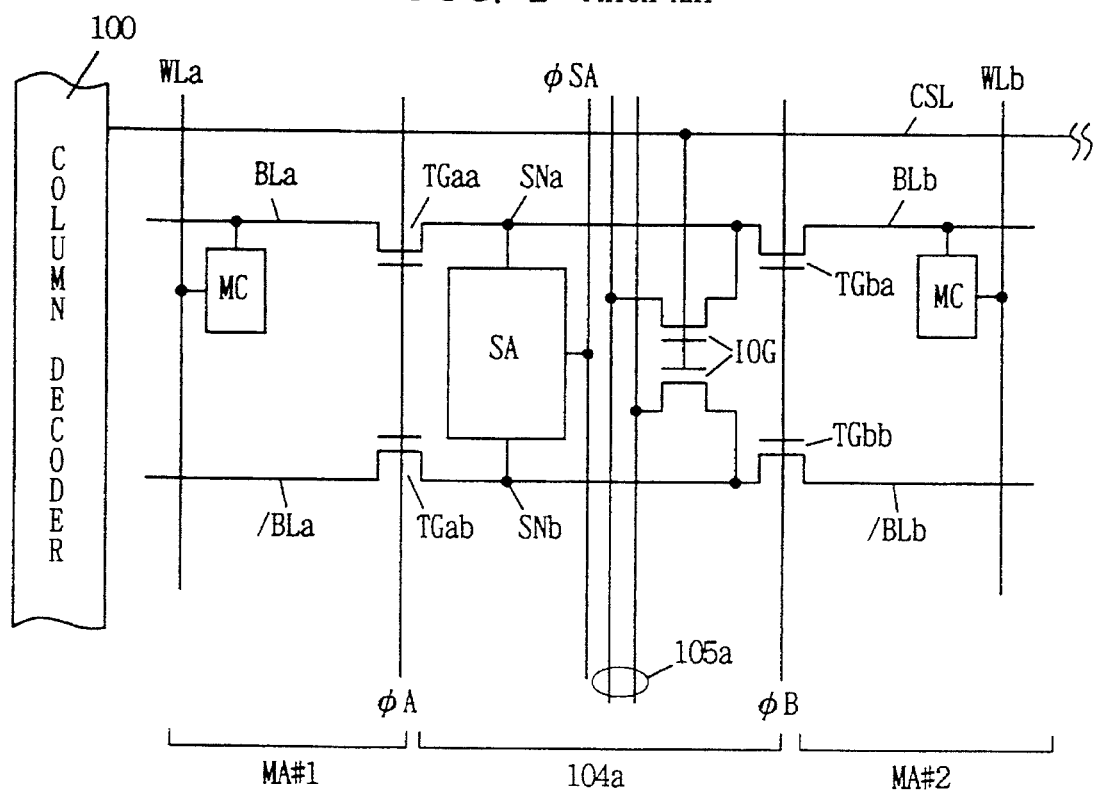
FIG. 2 shows a schematic detail of array blocks shown in FIG. 1.
Figure 3:
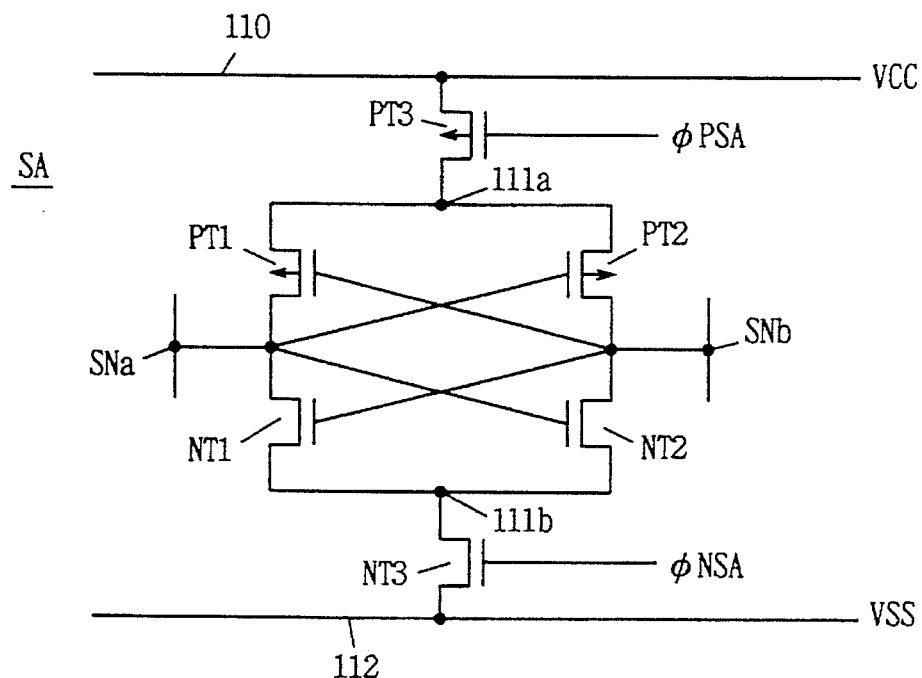
FIG. 3 shows a structure of a sense amplifier shown in FIG. 2.
Figure 4:
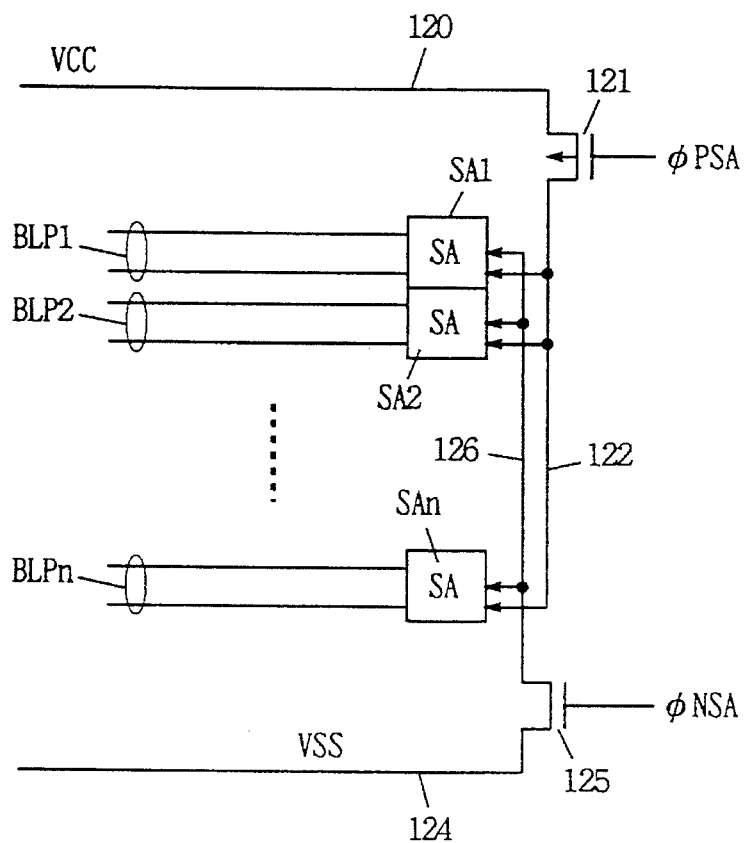
FIG. 4 shows a conventional arrangement of sense amplifier drive lines in a conventional semiconductor memory device.

In addition, ground lines 4 are interconnected by a conductive line 7, and power supply lines 5 are interconnected by a conductive line 8. Conductive lines 7 and 8 are preferably provided in a region between array regions in parallel with IO lines (see to FIG. 2) for mitigating area penalty. Fuse elements 6 may be provided corresponding to respective array blocks.

If a column select line 3a is short-circuited with a ground line 4a through a conductive particle at R7, fuse elements 6c and 6d are cut off, and the short-circuit portion is isolated from main ground line 140 and conductive line 7. If the column select line 3a is short-circuited with ground line 4a through a conductive particle at R8, a fuse element 6e is cut off, and the short-circuit portion is isolated from conductive line 7 and main ground line 140. If a short-circuit occurs near conductive line 7, the conductive line 7 is provided near a sense amplifier, IO gate and IO lines (see to FIG. 2) between array blocks, the conductive particle will cause short-circuiting at IO lines, too, and therefore the semiconductor device is treated as a defective product.

As for the short-circuiting between the column select line 3a and power supply line 5a or between the ground line 4a and the power supply line 5a, similar fuse cut off is effected. The column select line 3a is repaired by a redundant column select line.

The semiconductor device operates normally even with such short-circuiting. The meritorious advantage of provision of conductor lines 7 and 8 is as follows.

Figure 11A:
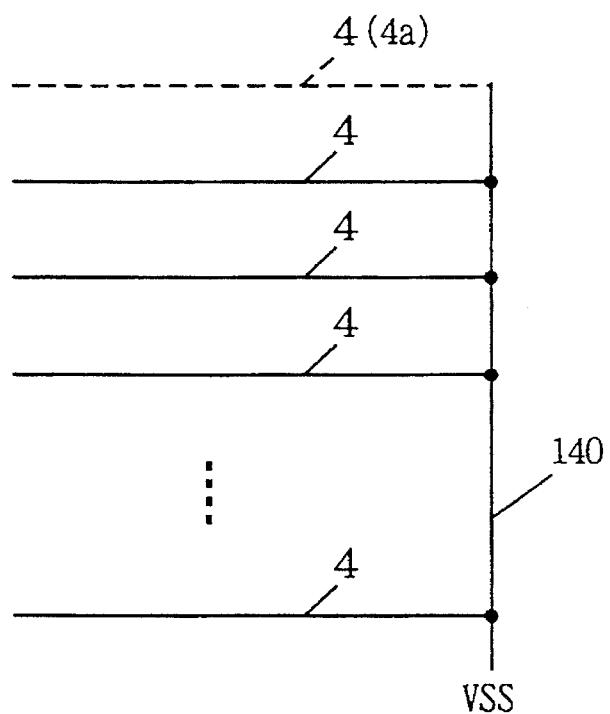
FIGS. 11A and 11B are diagrams used for explaining the meriotious advantage of the arrangement of interconnecting conductor lines of FIG. 10.

If a short-circuited column select line 4a is isolated from main ground line 140, the number of ground lines 4 connected to main ground line 140 is reduced as shown in FIG. 11A, which reduces a total line width of ground lines 4. A current distributed onto ground line 4a is dispersed onto the other ground lines 4, which increases a current flow through each ground line 4 to degrade the reliability of ground lines 4.

Figure 11B:
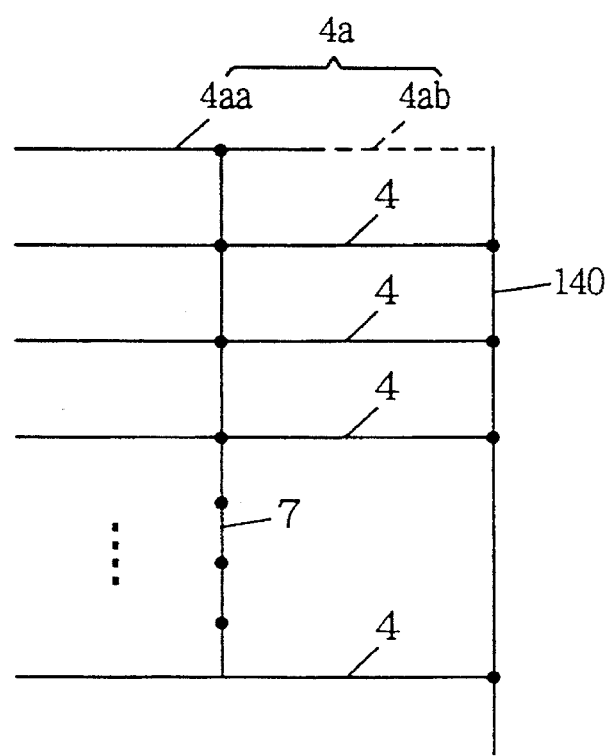

However, if a part 4aa of ground line 4a is interconnected through conductive line 7 with the other ground line 4 as shown in FIG. 11B, the reduction of total line width of ground lines 4 is mitigated, and a current can be dispersed onto the part 4aa, which reduces the degree of increase of current flow on each ground line 4, and the reliability of ground line 4 can be ensured.

The above discussion also holds for the power supply lines 5. Thus, reliability of ground lines 4 and power supply lines 5 can be ensured.

In the arrangements of FIGS. 9 and 10, a fuse element may be provided for each of column select lines 3.

Figure 12:
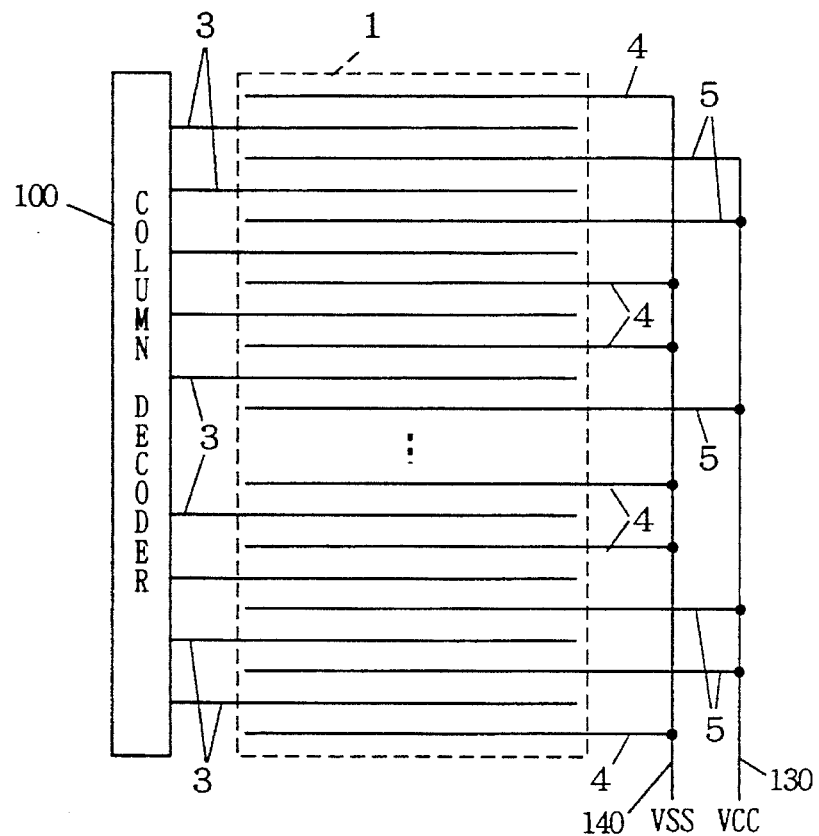
FIG. 12 shows an arrangement of a third embodiment of the present invention.

FIG. 12 shows an arrangement of a fourth embodiment of the present invention. In the arrangement of FIG. 12, a set of plural (2 in FIG. 12) ground lines 4 and a set of plural (2 in FIG. 12) are alternately arranged. Between two adjacent column select lines 3, a ground line 4 or a power supply line 5 is provided. A distances between adjacent ground line 4 and power supply line 5 can be increased, so that the possibility of short-circuit between a ground line 4 and a power supply line 5 can be reduced. In the arrangement shown in FIG. 12, a fuse element may be provided for each of ground lines 4 and power supply lines 5 or for each of column select lines 3.

Figure 13:
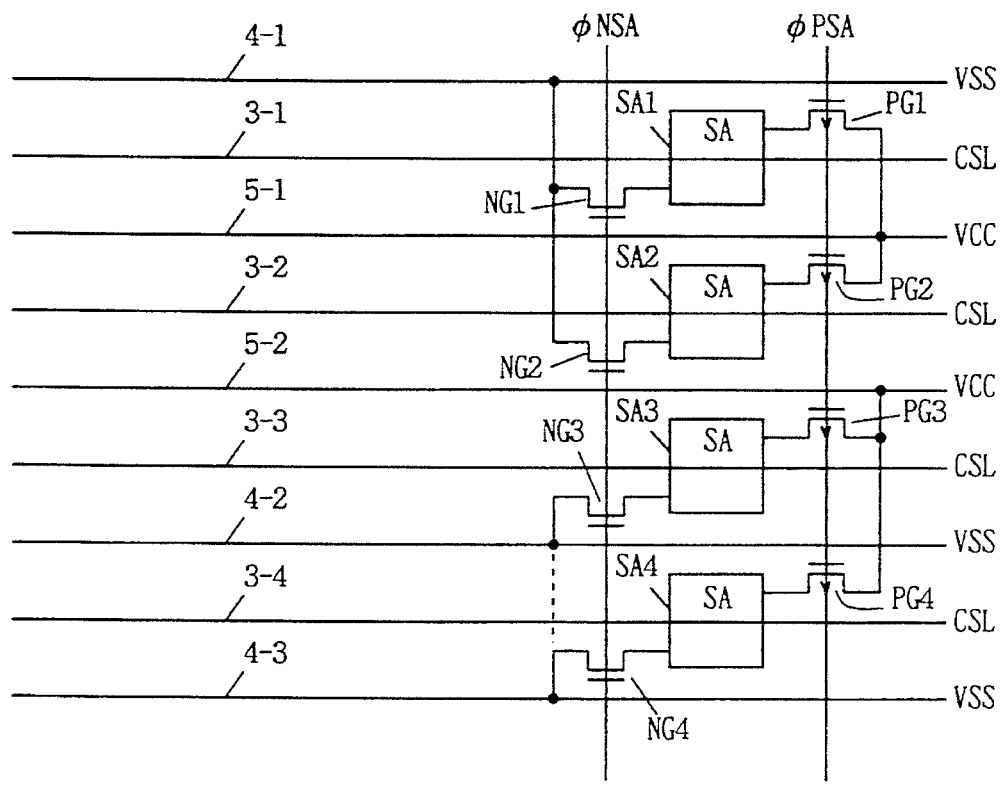
FIG. 13 shows a sense amplifier arrangement for the third embodiment of FIG. 12.

FIG. 13 shows an example of an arrangement of sense amplifiers, column select lines, power supply lines and ground lines according to the arrangement of FIG. 12. In FIG. 13, the arrangement of four columns are representatively shown.

In FIG. 13, sense amplifiers SA1-SAn are provided corresponding to column select lines 3-1-3-4. Ground lines 4-1-4-3 and power supply lines 5-1-5-2 are alternately provided on a basis of two lines.

Column select line 3-1 is provided between ground line 4-1 and power supply line 5-1. Column select line 3-2 is provided between power supply lines 5-1 and 5-2. Column select line 3-3 is provided between power supply line 5-2 and ground line 4-2. Column select line 3-4 is provided between ground lines 4-2 and 4-3.

Sense amplifiers SA1-SA4 are provided with N sense driving transistors NG1-NG4 responsive to sense amplifier activation signal φNSA and with P sense driving transistors PG1-PG4 responsive to sense amplifier activation signal φPSA. Driving transistors NG1 and NG2 are coupled to ground line 4-1 to receive ground voltage therefrom. Driving transistors NG3 and NG4 are coupled to ground lines 4-2 and 4-3, respectively. Ground lines 4-2 and 4-3 may be interconnected with each other, i.e., sources of N sense driving transistors NG3 and NG4 may be interconnected with each other via a lower level interconnection layer, as shown by a dotted line in FIG. 13.

P sense driving transistors PG1 and PG2 are coupled to power supply line 5-1 to receive supply voltage therefrom, and driving transistors PG3 and PG4 are coupled to power supply line 5-1 to receive supply voltage therefrom.

As clearly seen from FIG. 13, even a set of plural power supply lines and a set of plural ground lines are alternately arranged, any sense amplifier SAi (i=1-4) has driving transistors PGi and NGi receiving power supply voltage and ground voltage from near power supply line 5 and ground line 4, respectively, and each sense amplifier SAi can operate correctly and fast. In the arrangement of FIG. 13, a driving transistor NG may be shared between adjacent sense amplifiers SA, and also a driving transistor PG may be shared between adjacent sense amplifiers SA.

Figure 14:
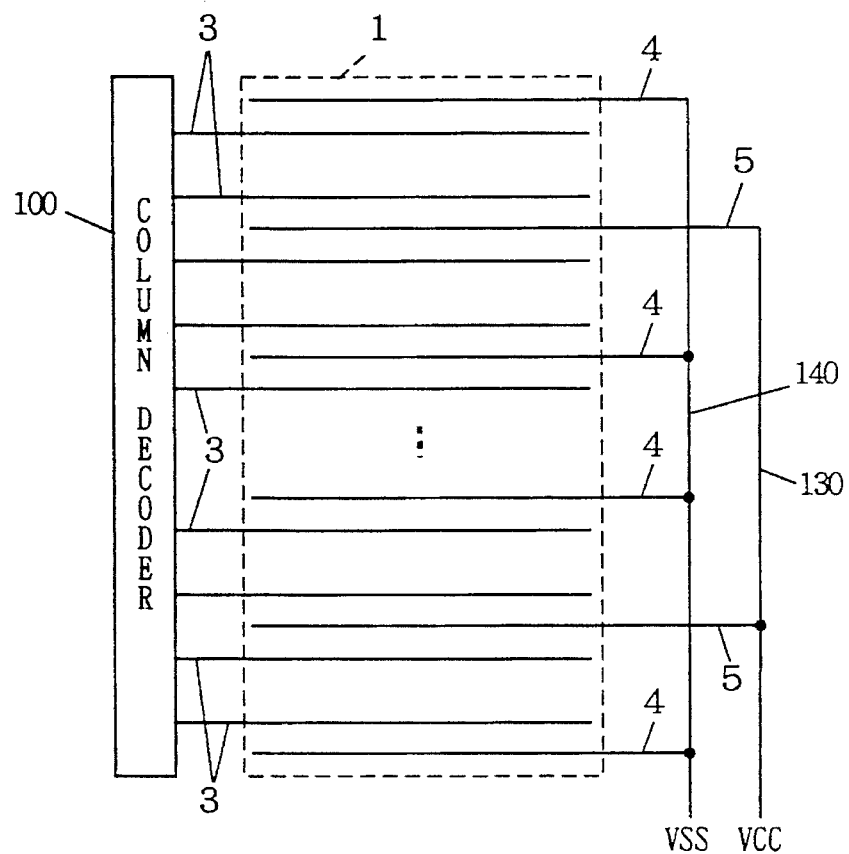
FIG. 14 shows an arrangement of fourth embodiment of the present invention.

FIG. 14 shows an arrangement of a further another embodiment of the present invention. In the arrangement of FIG. 14, a ground line 4 and a power supply line 5 are alternately arranged with plural (two in FIG. 14) column select lines CSL interposed between ground line 4 and power supply line 5. In the arrangement of FIG. 14, a distance between ground line 4 and power line 5 is made larger, and possibility of short-circuit between power supply line 5 and ground line 4 due to a conductive particle can be greatly reduced.

In the arrangement of FIG. 14, a fuse element may be provided for each column select line 3 or for each ground line 4 and each power supply line 5.

Figure 15:
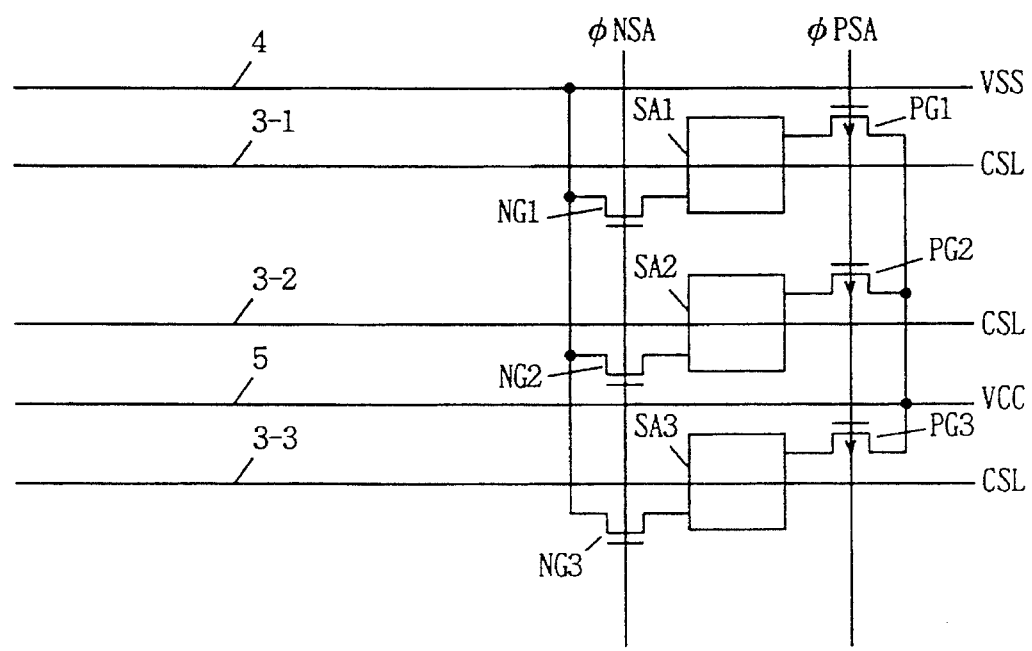
FIG. 15 shows a sense amplifier arrangement for the arrangement of the fourth embodiment of FIG. 14.

FIG. 15 shows connection configuration between sense driving transistors, and ground lines and power supply lines. In FIG. 15, three column select lines 3-1-3-3 are representatively shown. Column select lines 3-1 and 3-2 are interposed between ground line 4 and power supply line 5, and power supply line 5 is interposed between column select lines 3-2 and 3-3.

Sense amplifiers SA1-SA3 are provided corresponding to column select lines 3-1-3-3. Sense amplifiers SA1-SA3 are provided with N sense driving transistors NG1-NG3 responsive to sense amplifier activation signal φNSA and P sense driving transistors PG1-PG3 responsive to sense amplifier driving signal φPSA. Driving transistors NG1-NG3 are coupled to ground line 4 to receive ground voltage therefrom. Driving transistors PG1-PG3 are coupled to power supply line 5 to receive supply voltage therefrom. Layout pattern of sense driving transistors PG1-PG3 and NG1-NG3 is simple and the same layout pattern is repeated. Stable supply voltage VCC and ground voltage VSS can be supplied to sense amplifiers SA1-SA3 without degradation from near ground line 4 and power supply line 5.

In the arrangement of FIG. 15, a P driving transistor PG may be shared by three adjacent sense amplifiers SA1-SA3 and an N driving transistor NG may be shared by three adjacent sense amplifiers SA1-SA3.

In the above described embodiments, a column select line 3 selects a column of memory cells. Alternately, a column select line 3 may select a plurality of columns of memory cells at a time.

In addition, a semiconductor device may be a dynamic type memory device, and a static type memory device, and also may be a read only memory device. Further VCC and VSS may be a ground voltage and a negative voltage, respectively.

As described in detail heretofore, the present invention can provide a semiconductor device having a strong immunity against short-circuit between conductive lines extending over a memory array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory array having a plurality of memory cells arranged in rows and columns;

a plurality of conductive lines arranged extending in parallel with each other over said memory array;

a plurality of isolation means provided for each of said plurality of conductive lines, each of said plurality of isolation means dividing a corresponding conductive line into at least two segments upon isolation of the corresponding conductive line; and a column decoder for generating a column select signal for designating a column among said columns in said memory array, wherein said plurality of conductive lines includes conductor lines provided corresponding to respective outputs of said column decoder to transfer column select signal generated at corresponding outputs of said column decoder.

2. The semiconductor memory device according to claim 1, wherein each of said plurality of isolation means brings one segment among said at least two segments into an electrically floating state when isolating a corresponding conductive line.

3. A semiconductor device according to claim 1, wherein each of said plurality of isolation means is provided at a position near a corresponding output of said column decoder.

4. A semiconductor memory device according to claim 1, further comprising a main conductive line extending along one side of said memory array in a direction crossing said plurality of conductive lines, and wherein said plurality of conductive lines are coupled to said main conductive line, and each of said plurality of isolation means isolates a corresponding conductive line from said main conductive line.

5. A semiconductor memory device according to claim 1, wherein each of said plurality of conductive lines is provided with a second plurality of isolation means.

6. A semiconductor memory device according to claim 5, further comprising an interconnection line extending over said memory array to cross and interconnect said plurality of conductive lines in a predetermined region of said memory array.

7. A semiconductor memory device according to claim 1, wherein said plurality of conductive lines includes,
- a first plurality of said conductor lines of column select lines provided corresponding to the respective outputs of said column decoder to transfer a column select signal generated at a corresponding output,
- a second plurality of power lines for transferring a first supply voltage, and
- a third plurality of source lines for transferring a second supply voltage lower than said first supply voltage.

8. A semiconductor memory device according to claim 7, wherein said plurality of isolation means are provided for said first plurality of column select lines.

9. A semiconductor memory device according to claim 7, wherein said plurality of isolation means are provided for said second plurality of power supply lines and for said third plurality of source lines.

10. A semiconductor memory device according to claim 7, wherein said power lines and said source lines are alternately arranged with a column select line interposed between a power supply line and a source line.

11. A semiconductor memory device according to claim 7, wherein a set of a predetermined number of said power supply lines and a set of the predetermined number of said source lines are alternately arranged, and said conductor lines include a column select line interposed between power supply lines, a column select line between source lines, and a column select line, between a power supply line and a source line.

12. A semiconductor memory device according to claim 7, wherein said power supply lines and said source lines are alternately arranged with plural column select lines interposed between a power supply line and a ground line.

13. A semiconductor memory device according to claim 1, wherein said plurality of conductive lines includes a first plurality of said conductor lines each for transferring a signal, and a second plurality of second conductor lines for transferring a source voltage, said first conductor lines and said second conductor lines being alternately arranged and formed at the same level interconnection layer.

14. A semiconductor memory device, comprising:
- a memory cell array including a plurality of memory cells arranged in rows and columns;
- a first plurality of power lines provided in parallel with each other and extending over said memory cell array for transferring a power voltage; and
- a second plurality of source lines provided in parallel with said power lines and extending over said memory cell array for transferring a source voltage lower than said power voltage;
- a set of a predetermined number, greater than one, of said power lines and a set of the predetermined number, greater than one, of said source lines being alternately arranged, wherein
- no source line is interposed between the power lines of the set of a predetermined number of said power lines and no power line is interposed between the source lines of the set of a predetermined number of said source lines.

15. A semiconductor memory device comprising:
- a memory cell array including a plurality of memory cells arranged in rows and columns;
- a plurality of interconnection lines extending over said memory cell array and provided in parallel with each other for transferring a signal; and
- a plurality of first and second conductor lines provided in parallel with said plurality of interconnection lines to extend over said memory array for transferring a predetermined first and second constant level voltages, wherein
- a multiple, greater than one, of the interconnection lines is interposed between each of the first conductor lines and each of the second conductor lines.

16. A method of repairing a semiconductor memory device including a memory cell array having a plurality of memory cells arranged in rows and columns;
- a plurality of first conductor lines extending along the columns over said memory cell array for transferring column select signals, and a plurality of second conductor lines provided in parallel with said first conductor lines and extending over said memory cell array for transferring a predetermined voltage, comprising the steps of:
- detecting a short-circuit between a first conductor line among said plurality of first conductor lines and a second conductor line among said plurality of first conductor lines, said first conductor line being adjacent to said second conductor line; and
- isolating at least one of said first conductor line and said second conductor line to bring the isolated conductor line into an electrically floating state.

* * * * *